United States Patent
Jung

(10) Patent No.: US 11,069,404 B2
(45) Date of Patent: Jul. 20, 2021

(54) NONVOLATILE MEMORY DEVICE INCLUDING BANKS OPERATING IN DIFFERENT OPERATION MODES, OPERATION METHOD OF MEMORY CONTROLLER, AND STORAGE DEVICE COMPRISING NONVOLATILE MEMORY DEVICE AND MEMORY CONTROLLER

(71) Applicant: Samsung Electronics Co., Ltd., Suwon-si (KR)

(72) Inventor: Bong-Kil Jung, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/654,495

(22) Filed: Oct. 16, 2019

(65) Prior Publication Data

US 2020/0335163 A1 Oct. 22, 2020

(30) Foreign Application Priority Data

Apr. 22, 2019 (KR) ........................ 10-2019-0046813

(51) Int. Cl.
*G11C 13/00* (2006.01)

(52) U.S. Cl.
CPC ...... *G11C 13/0026* (2013.01); *G11C 13/0004* (2013.01); *G11C 13/004* (2013.01); *G11C 13/0061* (2013.01); *G11C 13/0069* (2013.01)

(58) Field of Classification Search
CPC . G11C 3/0026; G11C 13/0004; G11C 3/0069; G11C 13/0061; G11C 3/004
See application file for complete search history.

(56) References Cited

U.S. PATENT DOCUMENTS

| 7,502,251 B2* | 3/2009 | Choi ................. G11C 13/0004 365/163 |
| 8,203,872 B2* | 6/2012 | Parkinson .......... G11C 13/0069 365/163 |
| 8,782,370 B2 | 7/2014 | Rubowitz |
| 8,976,567 B2 | 3/2015 | Kim |
| 9,223,694 B2 | 12/2015 | Seo et al. |
| 9,830,985 B2* | 11/2017 | Chevallier ......... G11C 13/0035 |
| 2009/0213645 A1* | 8/2009 | Parkinson ............... G11C 11/56 365/163 |

(Continued)

FOREIGN PATENT DOCUMENTS

JP 2013-029879 A 2/2013

*Primary Examiner* — Gene N Auduong
(74) *Attorney, Agent, or Firm* — Harness, Dickey & Pierce, P.L.C.

(57) ABSTRACT

A nonvolatile memory device includes a command decoder that receives and decodes a first command and a second command, a first control circuit that generates first control information under control of the command decoder decoding the first command, a second control circuit that generates second control information under control of the command decoder decoding the second command, a first bank that includes a first memory cell which operates based on the first control information, and a second bank that includes a second memory cell which operates based on the second control information. A first time to output data from the first bank in response to the first command is different from a second time to output data from the second bank in response to the second command.

20 Claims, 11 Drawing Sheets

(56) References Cited

U.S. PATENT DOCUMENTS

| | | |
|---|---|---|
| 2012/0271985 A1 | 10/2012 | Jeong et al. |
| 2013/0250651 A1* | 9/2013 | Sills .................... G11C 13/003 365/148 |
| 2017/0017411 A1 | 1/2017 | Choi et al. |
| 2017/0076794 A1 | 3/2017 | Zeng et al. |
| 2017/0309343 A1 | 10/2017 | Lim |
| 2018/0196749 A1 | 7/2018 | Koo et al. |

* cited by examiner

NONVOLATILE MEMORY DEVICE INCLUDING BANKS OPERATING IN DIFFERENT OPERATION MODES, OPERATION METHOD OF MEMORY CONTROLLER, AND STORAGE DEVICE COMPRISING NONVOLATILE MEMORY DEVICE AND MEMORY CONTROLLER

CROSS-REFERENCE TO RELATED APPLICATIONS

This application claims priority under 35 U.S.C. § 119 to Korean Patent Application No. 10-2019-0046813 filed on Apr. 22, 2019, in the Korean Intellectual Property Office, the disclosures of which are incorporated by reference herein in their entireties.

BACKGROUND

1. Field

Embodiments of the inventive concepts described herein relate to semiconductor memory devices, and more particularly, relate to nonvolatile memory devices including banks that operate in different operation modes, operation methods of a memory controller, and storage devices including the nonvolatile memory devices and the memory controllers.

2. Description of the Related Art

A request that a host transmits to a memory system is classified based on an operation purpose of the memory system and a characteristic of data to be read or written. For example, requests of the host may be used to request the memory system operate at the highest speed, request minimum power consumption of the memory system, or request an operation having high reliability.

To maximize performance, the memory system should to perform individual operations on the basis of different requests of the host. To this end, there is a need to control a memory device depending on different requests of the host by dividing the memory device in the memory system into a plurality of areas and separately controlling the areas thus divided.

SUMMARY

Embodiments of the inventive concepts provide a nonvolatile memory device, an operation method of a memory controller, and a storage device including the nonvolatile memory device and the memory controller.

According to some example embodiments, a nonvolatile memory device may include a command decoder that receives and decodes a first command and a second command, a first control circuit that generates first control information under control of the command decoder decoding the first command, a second control circuit that generates second control information under control of the command decoder decoding the second command, a first bank that includes a first memory cell which operates based on the first control information, and a second bank that includes a second memory cell which operates based on the second control information. A first time to output data from the first bank in response to the first command may be different from a second time to output data from the second bank in response to the second command.

According to some example embodiments, an operation method of a memory controller which is connected with a memory device may include dividing a plurality of banks of the memory device into banks operating in a first mode and banks operating in a second mode different from the first mode, receiving a first request corresponding to the first mode from a host and transmitting a first bank address corresponding to a first bank of the banks operating in the first mode to the memory device in response to the first request, and further receiving a second request corresponding to the second mode from the host and transmitting a second bank address corresponding to a second bank of the banks operating in the second mode to the memory device in response to the second request.

According to some example embodiments, a storage device may include a nonvolatile memory device that includes a first bank, a second bank, a first control circuit configured to control the first bank in response to first control information, and a second control circuit configured to control the second bank in response to second control information, and a memory controller that is configured to transmit a first read command to the nonvolatile memory device in response to a first request of a host to read the first bank and configured to transmit a second read command to the nonvolatile memory device in response to a second request of the host to read the second bank. A first latency from a time the memory controller transmits the first read command to a time the memory controller receives data of the first bank corresponding to the first read command may be different from a second latency from a time the memory controller transmits the second read command to a time the memory controller receives data of the second bank corresponding to the second read command.

BRIEF DESCRIPTION OF THE DRAWINGS

The above and other objects and features of the inventive concepts will become apparent by describing in detail example embodiments thereof with reference to the accompanying drawings.

DETAILED DESCRIPTION

Below, embodiments of the inventive concepts will be described in detail and clearly to such an extent that an ordinary one in the art easily implements the inventive concepts.

Figure 1:
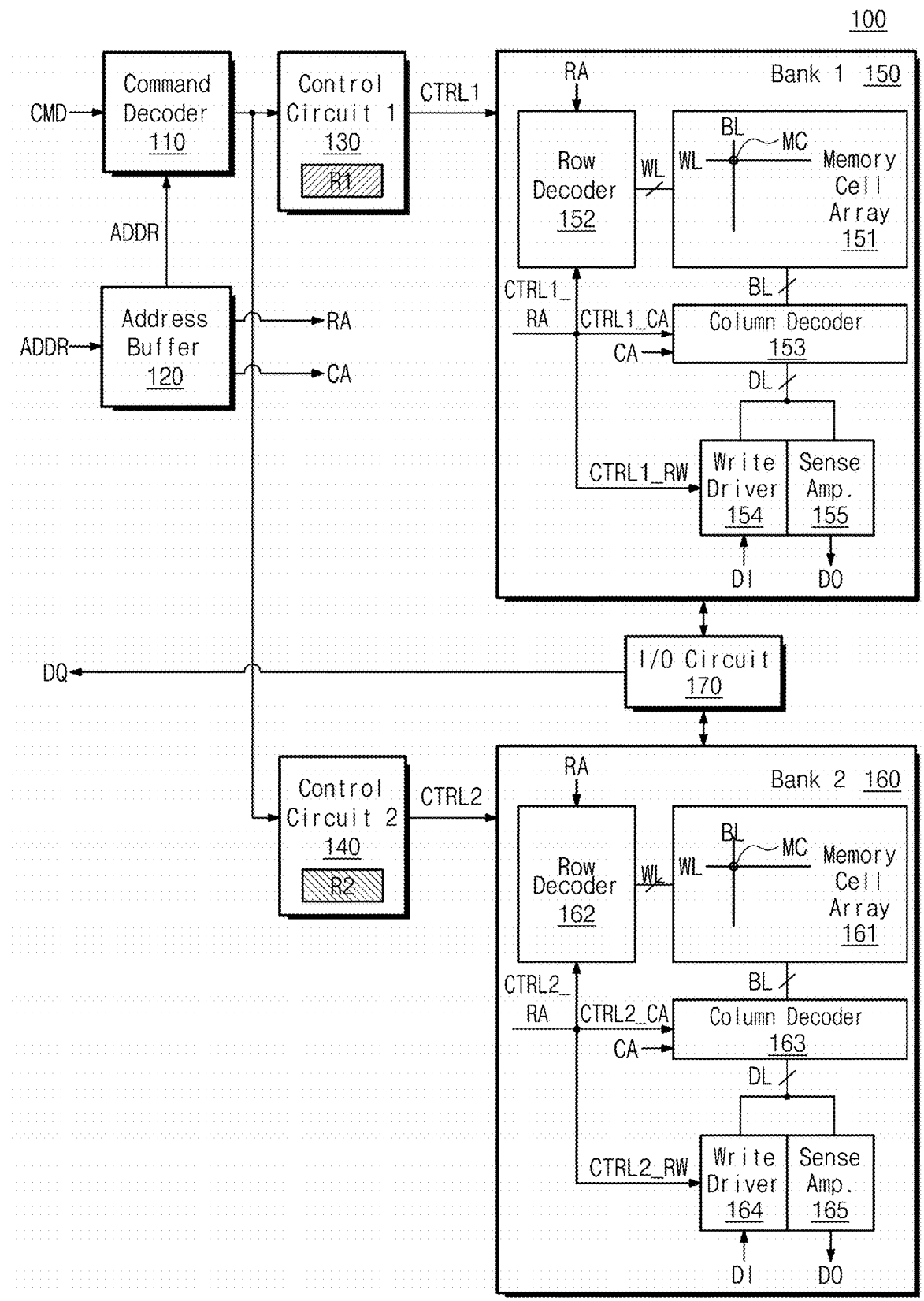
FIG. 1 is a block diagram illustrating a nonvolatile memory device according to some example embodiments of the inventive concepts.

FIG. 1 is a block diagram illustrating a nonvolatile memory device according to some example embodiments of the inventive concepts. A nonvolatile memory device 100 may include a command decoder 110, an address buffer 120, first and second control circuits 130 and 140, first and second banks 150 and 160, and/or an input/output circuit 170.

The nonvolatile memory device 100 may receive a command CMD and an address ADDR from an external device (e.g., a memory controller). The nonvolatile memory device 100 may write data DQ in one of the first and second banks 150 and 160 based on the command CMD and the address ADDR. The nonvolatile memory device 100 may read data stored in one of the first and second banks 150 and 160 based on the command CMD and the address ADDR and may output the read data as the data DQ.

In some example embodiments, one or more, or all, of the command decoder 110, first and second control circuits 130 and 140, memory controller, and/or any parts thereof, may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., memory device), for example a solid state drive (SSD), storing a program of instructions, and a processor configured to execute the program of instructions to implement the functionality of one or more, or all, of the command decoder 110, first and second control circuits 130 and 140, and memory controller.

The command decoder 110 may decode the command CMD received from an external device (e.g., a memory controller). The command decoder 110 may receive the address ADDR. The command decoder 110 may determine whether the received command CMD is associated with the first bank 150 or the second bank 160, with reference to a bank address BA included in the address ADDR. The command decoder 110 may select and/or activate one of the first control circuit 130 and the second control circuit 140, based on the command CMD and the address ADDR. For example, the command CMD may include a read command, a write command, an activation command, an update command for the first bank 150 or the second bank 160, and/or a re-categorizing command for the first bank 150 or the second bank 160.

The address buffer 120 may receive the address ADDR from an external device (e.g., a memory controller). The address buffer 120 may provide the address ADDR to the command decoder 110. The address buffer 120 may provide the address ADDR to one of the first control circuit 130 and the second control circuit 140 under control of the command decoder 110.

Under control of the command decoder 110, the address buffer 120 may provide the received address ADDR to row decoders 152 and 162 as a row address RA and/or may provide the received address ADDR to column decoders 153 and 164 as a column address CA.

The first control circuit 130 may generate first control information under control of the command decoder 110 and may provide the first bank 150 with a first control signal CTRL1 that is based on the first control information. The second control circuit 140 may generate second control information under control of the command decoder 110 and may provide the second bank 160 with a second control signal CTRL2 that is based on the second control information. The first and second control circuits 130 and 140 may respectively control operations of the first and second banks 150 and 160 by using the first and second control signals CTRL1 and CTRL2.

The first control signal CTRL1 may include a first row control signal CTRL1_RA for controlling the row decoder 152, a first column control signal CTRL1_CA for controlling the column decoder 153, and a first read/write control signal CTRL1_RW for controlling a write driver 154 and a sense amplifier 155. The second control signal CTRL2 may include a second row control signal CTRL2_RA for controlling the row decoder 162, a second column control signal CTRL2_CA for controlling the column decoder 163, and a second read/write control signal CTRL2_RW for controlling a write driver 164 and a sense amplifier 165. The first and second row control signals CTRL1_RA and CTRL2_RA, the first and second column control signals CTRL1_CA and CTRL2_CA, and the first and second read/write control signals CTRL1_RW and CTRL2_RW will be more fully described with reference to FIGS. 4 and 5.

The first control circuit 130 may include a register R1. The second control circuit 140 may include a register R2. The registers R1 and R2 may respectively include the first and second control information associated with modes of operations, operation characteristics, and operation settings of the first and second banks 150 and 160. Here, the mode of operation, the operation characteristic, and the operation settings of the first bank 150 may include at least one of a speed at which the first bank 150 operates, power consumption of the first bank 150, and information about reliability for the first bank 150 to operate. The first control circuit 130 may generate the first control signal CTRL1 with reference to the register R1. The second control circuit 140 may generate the second control signal CTRL2 with reference to the register R2.

In some example embodiments, the command decoder 110 may receive an update request for the first bank 150 from an external device (e.g., a host). The first control circuit 130 may store not the first control information but the second control information under control of the command decoder 110 that receives the update request. When the command decoder 110 receives a command for a memory cell of the first bank 150 from an external device, the memory cell of the first bank 150 may operate based on the second control information instead of the first control information.

The first bank 150 may include memory cells MC that operate based on the first control information. The second bank 160 may include memory cells MC that operate based on the second control information. The first and second banks 150 and 160 may perform a write operation or a read operation independently or simultaneously. The write operation may include a set operation of changing a logical value of the memory cell MC from a first logical value of "0" to a second logical value of "1" and a reset operation of changing the logical value of the memory cell MC from the second logical value of "1" to the first logical value of "0". Here, logical values that are stored in the memory cell MC through the set operation and the reset operation are only an example.

The first and second banks 150 and 160 may perform the write operation or the read operation based on the information of the operation settings. Here, the information of the operation settings may include information about a signal(s) to perform the write operation or the read operation on the first and second banks 150 and 160. In some example embodiments, the information of the operation settings may include information about a bit line signal, a word line signal, a set signal, and a reset signal. The information about the bit line signal, the word line signal, the set signal, and the reset signal may include, but is not limited to, information about an amplitude, a pulse duration (or a pulse period), and a timing of each signal.

The first and second banks 150 and 160 may operate in different modes. For example, the first bank 150 may operate in a mode in which reliability is low, power consumption is great, or a speed is fast; the second bank 160 may operate in another mode in which reliability is high, power consumption is low, or a speed is slow.

An example is illustrated in FIG. 1 as the number of banks included in the nonvolatile memory device 100 is "2", but the inventive concepts are not limited thereto. The number of banks included in the nonvolatile memory device 100 is not limited to any number.

The first bank 150 may include a memory cell array 151, the row decoder 152, the column decoder 153, the write driver 154, and the sense amplifier 155. The second bank 160 may include a memory cell array 161, the row decoder 162, the column decoder 163, the write driver 164, and the sense amplifier 165. The second bank 160 may be implemented to be substantially the same as the first bank 150. Accordingly, below, the first bank 150 and the components of the first bank 150 will be described, and description associated with the second bank 160 and the components of the second bank 160 will be omitted to avoid redundancy.

In FIG. 1, the description will be given under the condition that the first bank 150 includes the memory cell array 151, the row decoder 152, the column decoder 153, the write driver 154, and the sense amplifier 155. However, unlike FIG. 1, the first bank 150 may be called only the memory cell array 151, and the row decoder 152, the column decoder 153, the write driver 154, and the sense amplifier 155 may be included in any other component.

The memory cell array 151 may include the memory cells MC connected to word lines WL and bit lines BL. Each of the memory cells MC may be connected between one of the word lines WL and one of the bit lines BL. For example, the memory cell array 151 may be a cross point memory cell array. The memory cell array 151 may be controlled in the unit of a plurality of tiles (not illustrated). The memory cell array 151 may include DRAM (Dynamic Random Access Memory) cells, SRAM (Static Random Access Memory) cells, PRAM (Phase-change Random Access Memory) cells, ReRAM (Resistance Random Access Memory) cells, FeRAM (Ferroelectric Random Access Memory) cells, TRAM (thyristor random access memory) cells, MRAM (Magnetic Random Access Memory) cells, or the like, but the inventive concepts are not limited thereto. The memory cell array 151 will be more fully described with reference to FIG. 3.

The row decoder 152 may be connected with the memory cell array 151 through the word lines WL. The row decoder 152 may receive the row address RA from the address buffer 120. The row decoder 152 may select at least one of the word lines WL based on the row address RA. The row decoder 152 may apply a selection voltage and/or a selection current to the selected word line, and may apply a non-selection voltage and/or a non-selection current to unselected word lines.

The column decoder 153 may be connected with data lines DL. The column decoder 153 may be connected with the memory cell array 151 through the bit lines BL. The column decoder 153 may receive the column address CA from the address buffer 120. The column decoder 153 may select at least one of the bit lines BL based on the column address CA.

In the write operation, the write driver 154 may write data in the memory cell MC. In this case, the write driver 154 may write data by performing the set operation or the reset operation such that a resistance value of the memory cell MC is changed. In the set operation or the reset operation, the write driver 154 may apply a write pulse to the memory cell MC. The write driver 154 may be connected with the data lines DL.

The sense amplifier 155 may generate a first read signal, which has an amplitude or a pulse period determined according to the first control information, with regard to a memory cell in the first bank 150. The first control circuit 130 may load a value of the amplitude or the pulse period of the first read signal from at least one memory cell included in the first bank 150.

In the read operation, the sense amplifier 155 may read data from the memory cell MC. In this case, the sense amplifier 155 may read data by determining a range of a resistance value of the memory cell MC. The sense amplifier 155 may be connected with the data lines DL. The sense amplifier 155 may be also referred to as a "read circuit".

The input/output circuit 170 may exchange the data DQ with one of the first and second banks 150 and 160. Also, the input/output circuit 170 may exchange the data DQ with an external device (e.g., a memory controller).

The input/output circuit 170 may transmit the data DQ from one of the first and second banks 150 and 160 to an external device and may transmit the data DQ from the external device to one of the first and second banks 150 and 160.

Figure 2:
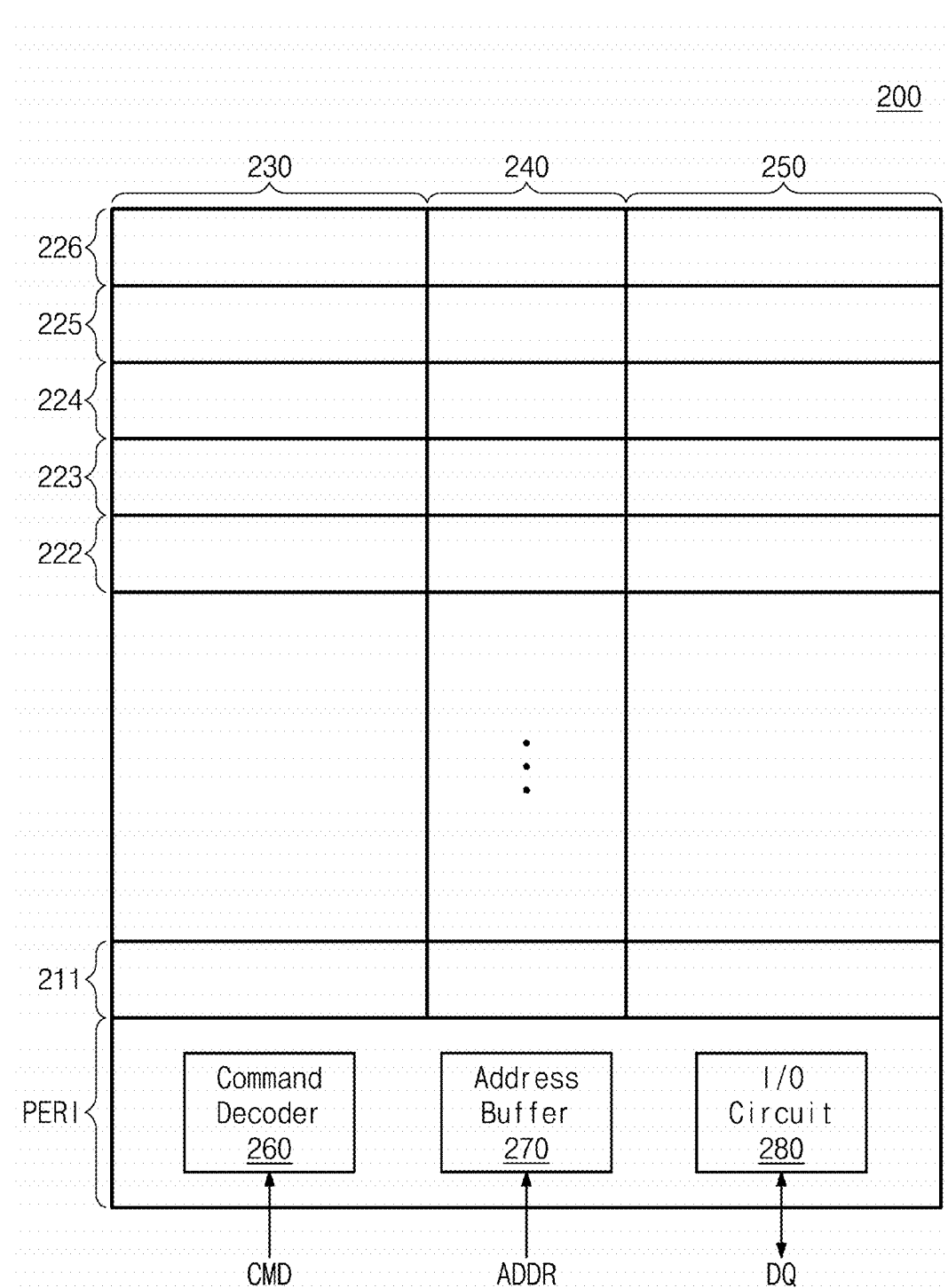
FIG. 2 is an architecture of a nonvolatile memory device according to some example embodiments of the inventive concepts.

FIG. 2 is an architecture of a nonvolatile memory device according to some example embodiments of the inventive concepts. FIG. 2 will be described with reference to FIG. 1. A nonvolatile memory device 200 may include first to sixteenth banks 211 to 226 and a peripheral circuit PERI. The nonvolatile memory device 200 may be a cross point nonvolatile memory device. The first to sixteenth banks 211 to 226 and the peripheral circuit PERI may be formed on a semiconductor substrate. Below, it is assumed that a first bank 211 is the first bank 150 of FIG. 1.

Like the first bank 150 of FIG. 1, the first bank 211 may include the memory cell array 151, the row decoder 152, the column decoder 153, the write driver 154, and the sense amplifier 155. However, the first bank 211 may further include the first control circuit 130.

The first bank 211 is divided into first, second, and third areas 230, 240, and 250. The first bank 211 may include the memory cell array 151 in the first to third areas 230 to 250.

The memory cell array 151 may be placed in the first area 230 and the third area 250. Circuits (e.g., the first control circuit 130) for controlling the memory cell array 151 may be placed in the second area 240.

The first bank 211 may include the row decoder 152, the column decoder 153, the write driver 154, the sense amplifier 155, and the first control circuit 130 in the second area 240.

The second to sixteenth banks 212 to 226 may have the same structure and configuration as the first bank 211. Each of the second to sixteenth banks 212 to 226 may include components in the first bank 150.

The first to sixteenth banks 211 to 226 may perform write operations or read operations independently of each other. For example, the first to sixteenth banks 211 to 226 may perform the write operations or the read operations based on the different operation setting information. For another example, each of the first to sixteenth banks 211 to 226 may be classified as a bank that performing the write operation or the read operation based on first operation setting information or as a bank that performing the write operation or the read operation based on second operation setting information. For example, the first bank 211 may perform the write operation or the read operation based on the first operation setting information, and the second to sixteenth banks 212 to 226 may perform the write operation or the read operation based on the second operation setting information Referring to FIG. 2, the number of banks included in the nonvolatile memory device 200 is "16", but the inventive concepts are not limited thereto. That is, the number of banks included in the nonvolatile memory device 200 is not limited to any number.

The peripheral circuit PERI may receive the address ADDR, the command CMD, and a control signal CTRL from an external device (e.g., a memory controller). The peripheral circuit PERI may exchange the data DQ with the external device (e.g., a memory controller) in response to the received signal. The peripheral circuit PERI may include a command decoder 260, an address buffer 270, and an input/output circuit 280. The command decoder 260, the address buffer 270, and the input/output circuit 280 may be substantially the same as the command decoder 110, the address buffer 120, and the input/output circuit 170 of FIG. 1, respectively. The command decoder 260, the address buffer 270, and the input/output circuit 280 may be connected with components in the second area 240.

With regard to the first to sixteenth banks 211 to 226, manufacturing processes, electrical signals that are provided to the first to sixteenth banks 211 to 226, and the degree of degradation according to the use of the first to sixteenth banks 211 to 226 may be different from each other. As such, a difference between optimized signals (e.g., a read signal and a write signal) for operating the first to sixteenth banks 211 to 226 may increase. Also, because one bank is selected based on a bank address and operates, a characteristic difference between components in the bank may be smaller than a characteristic difference between components in different banks. The characteristic difference may depend on a retention time, a temperature, a transfer path of a control signal, or the degree of variation of a pulse that is provided to a write driver. In the inventive concepts, because the first to sixteenth banks 211 to 226 included in the nonvolatile memory device 200 operate depending on respective operation settings, the performance of the nonvolatile memory device 200 may be optimized.

Figure 3:
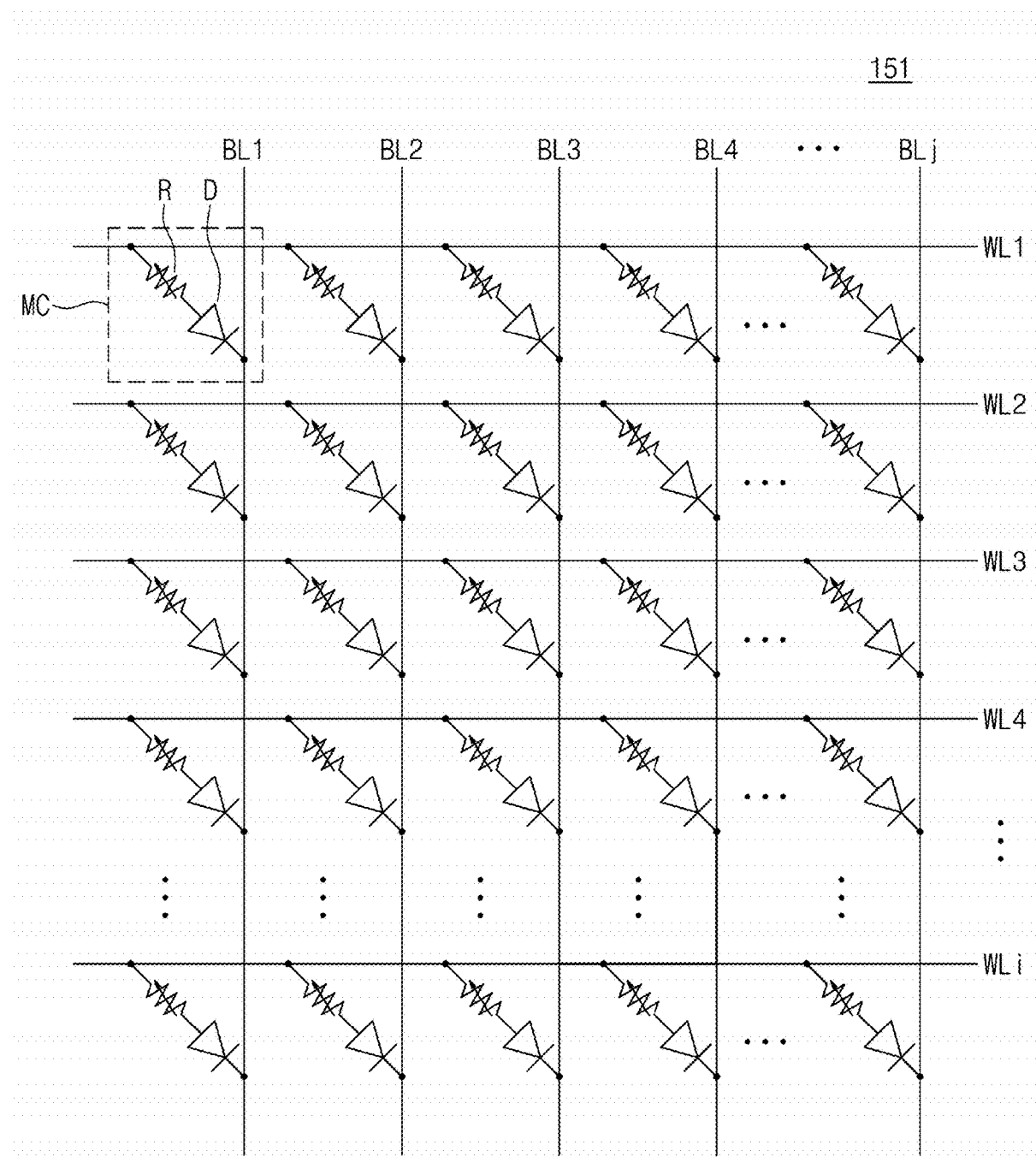
FIG. 3 is a block diagram illustrating an example of a memory cell array included in a nonvolatile memory device of FIG. 1.

FIG. 3 is a block diagram illustrating an example of a memory cell array included in a nonvolatile memory device of FIG. 1. An example is illustrated in FIG. 3 as the memory cell array 151 includes the memory cells MC arranged in a two-dimensional structure, but the memory cells MC may be arranged in a three-dimensional structure.

The memory cells MC may be arranged in rows and columns. The memory cells MC in the rows may be connected to first to i-th word lines WL1 to WLi. The memory cells MC in the columns may be connected to first to j-th bit lines BL1 to BLj. Here, the number "i" of word lines, the number "j" of bit lines, and the number of memory cells may be variously changed according to some example embodiments.

Each of the memory cells MC may be connected to one word line and one bit line. According to some example embodiments, each of the memory cells MC may include a variable resistance element "R" and a selection element "D". Here, the variable resistance element "R" may be referred to as a "variable resistance material", and the selection element "D" may be referred to as a "switching element".

In some example embodiments, the variable resistance element "R" may be connected between one of the first to i-th word lines WL1 to WLi and the selection element "D", and the selection element "D" may be connected between the variable resistance element "R" and one of the first to j-th bit lines BL1 to BLj. However, the inventive concepts are not limited thereto. For example, the selection element "D" may be connected between one of the first to i-th word lines WL1 to WLi and the variable resistance element "R", and the variable resistance element "R" may be connected between the selection element "D" and one of the first to j-th bit lines BL1 to BLj.

According to some example embodiments, the variable resistance element "R" may have one of a plurality of resistance states by an electrical pulse applied thereto. In some example embodiments, the variable resistance element "R" may include a phase change material, of which a crystal (or crystalline) state varies depending on a voltage magnitude or a current amount. The phase change material may include various kinds of materials such as GaSb, InSb, InSe, Sb2Te3, GeTe, GeSbTe (as known as GST), GaSeTe, InSbTe, SnSb2Te4, InSbGe, AgInSbTe, (GeSn)SbTe, GeSb (SeTe), and/or Te81Ge15Sb2S2.

The phase change material may have an amorphous state having a relatively great resistance and a crystal state having a relatively small resistance. A phase of the phase change material may change by Joule's heat that is generated according to the amount of current. Data may be written by using the phase change of the phase change material.

The selection element "D" may be connected between one of the first to i-th word lines WL1 to WLi and one of the first to j-th bit lines BL1 to BLj and may control the supply of a voltage or current to the variable resistance element "R" based on signals (e.g., a word line signal and a bit line signal) applied to the word line and the bit line connected with the selection element "D". In some example embodiments, the selection element "D" may be a PN junction or PIN junction diode. An anode of the diode may be connected to the variable resistance element "R", and a cathode of the diode may be connected to one of the first to i-th word lines WL1 to WLi. In this case, when a voltage difference between the anode and the cathode of the diode is greater than a threshold voltage of the diode, the diode may be turned on, and thus, a current may be supplied to the variable resistance element "R". An example is illustrated in FIG. 3 as the selection element "D" is a diode, but the inventive concepts are not limited thereto. For example, the selection element "D" may be implemented with a switchable element (e.g., a transistor).

As in some example embodiments of the inventive concepts, the memory cell array 151 may be implemented with a three-dimensional (3D) memory array. The 3-dimensional memory array may be monolithically formed in one or more physical level(s) of a memory cell array having an active area arranged on a circuit related on a silicon substrate and an operation of memory cells. The circuit related to an operation of memory cells may be located in a substrate and/or on the substrate. The term "monolithic" means that layers of each level of the array are directly deposited on the layers of each underlying level of the array. The 3D memory array may be configured such that a variable resistance element and a switching element including at least one memory cell are vertically arranged according to a vertical orientation.

Figure 4:
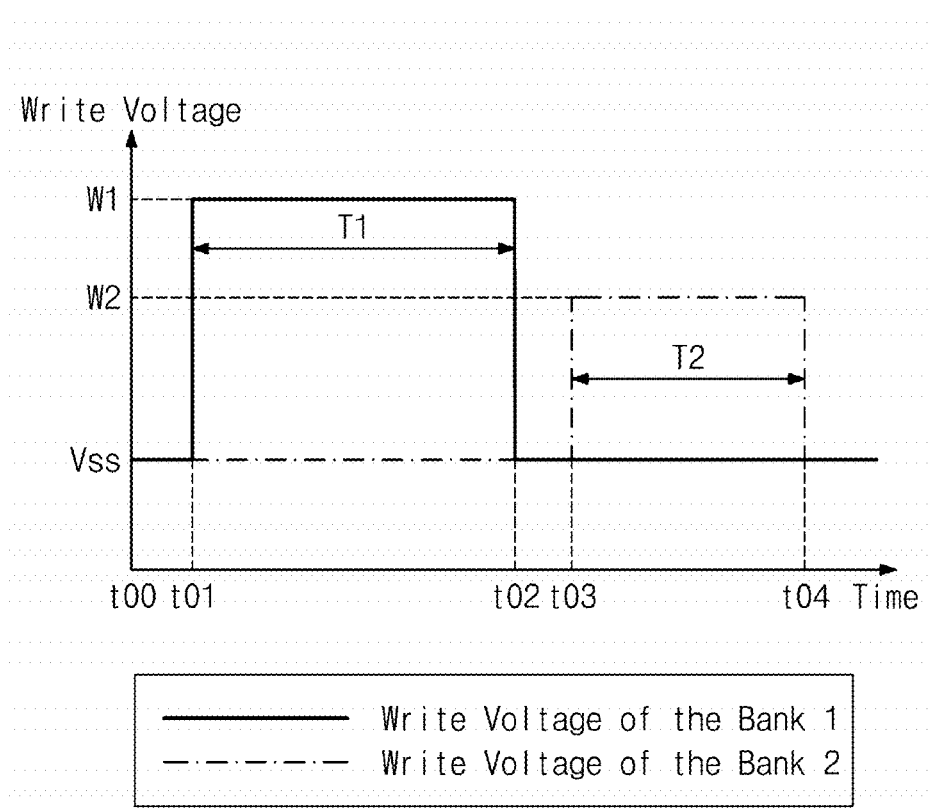
FIG. 4 is a graph illustrating write voltages to be provided to first and second banks of FIG. 1 over time.

FIG. 4 is a graph illustrating write voltages to be provided to first and second banks of FIG. 1 over time. FIG. 4 will be described with reference to FIG. 1. Only a write voltage is illustrated in FIG. 4, but the principle of FIG. 4 may be identically applied to a read voltage of the first and second banks 150 and 160.

The write voltage of the first bank 150 may be a voltage that is provided to a memory cell included in the first bank 150 for the write operation of the first bank 150. A write voltage of the second bank 160 may be a voltage that is provided to a memory cell included in the second bank 160 for the write operation of the second bank 160.

In FIG. 4, in response to the first control signal CTRL1, the first control circuit 130 may perform the write operation on a memory cell included in the first bank 150, based on the write voltage of the first bank 150 having an amplitude of "W1-VSS". Is response to the second control signal CTRL2, the second control circuit 140 may perform the write operation on a memory cell included in the second bank 160, based on the write voltage of the second bank 160 having an amplitude of "W2-VSS". That is, the first and second banks 150 and 160 may operate based on write voltages having different amplitudes. Referring to FIG. 4, because the amplitude of the write voltage of the second bank 160 is smaller than the amplitude of the write voltage of the first bank 150, the power consumption of the second bank 160 may be smaller than the power consumption of the first bank 150. As such, the nonvolatile memory device 100 may set banks such that power consumption is different.

Referring to FIG. 4, a pulse duration of the write voltage of the first bank 150 may be T1, and a pulse duration of the write voltage of the second bank 160 may be T2. T1 and T2 may be different from each other. Here, T1 and T2 may be different from each other due to differences between activation times, deactivation times, application times, and non-application times of the write voltages of the first and second banks 150 and 160.

In the case where T1 and T2 are different from each other, for example, T1 may be greater than T2. The pulse duration of the write voltage of the first bank 150 may be greater than the pulse duration of the write voltage of the second bank 160, and thus, the first bank 150 may operate with higher reliability than the second bank 160. In contrast, the pulse duration of the write voltage of the second bank 160 may be smaller than the pulse duration of the write voltage of the first bank 150, and thus, the second bank 160 may operate faster than the first bank 150.

The second bank 160 may be activated while the write/read operation of the first bank 150 is performed. In some example embodiments, in response to the first read/write control signal CTRL1_RW in the first control signal CTRL1, the first write driver 154 of the first bank 150 may provide a write pulse to a memory cell included in the first bank 150 and may provide a voltage across the memory cell of the first bank 150. The first control circuit 130 may perform the read operation on the memory cell of the first bank 150 based on the voltage across the memory cell of the bank 150. While the read operation is performed on the memory cell of the first bank 150, in response to the second read/write control signal CTRL2_RW in the second control signal CTRL2, the second write driver 164 may provide a write pulse to a memory cell included in the second bank 160 and may provide a voltage across the memory cell of the second bank 160.

Figure 5:
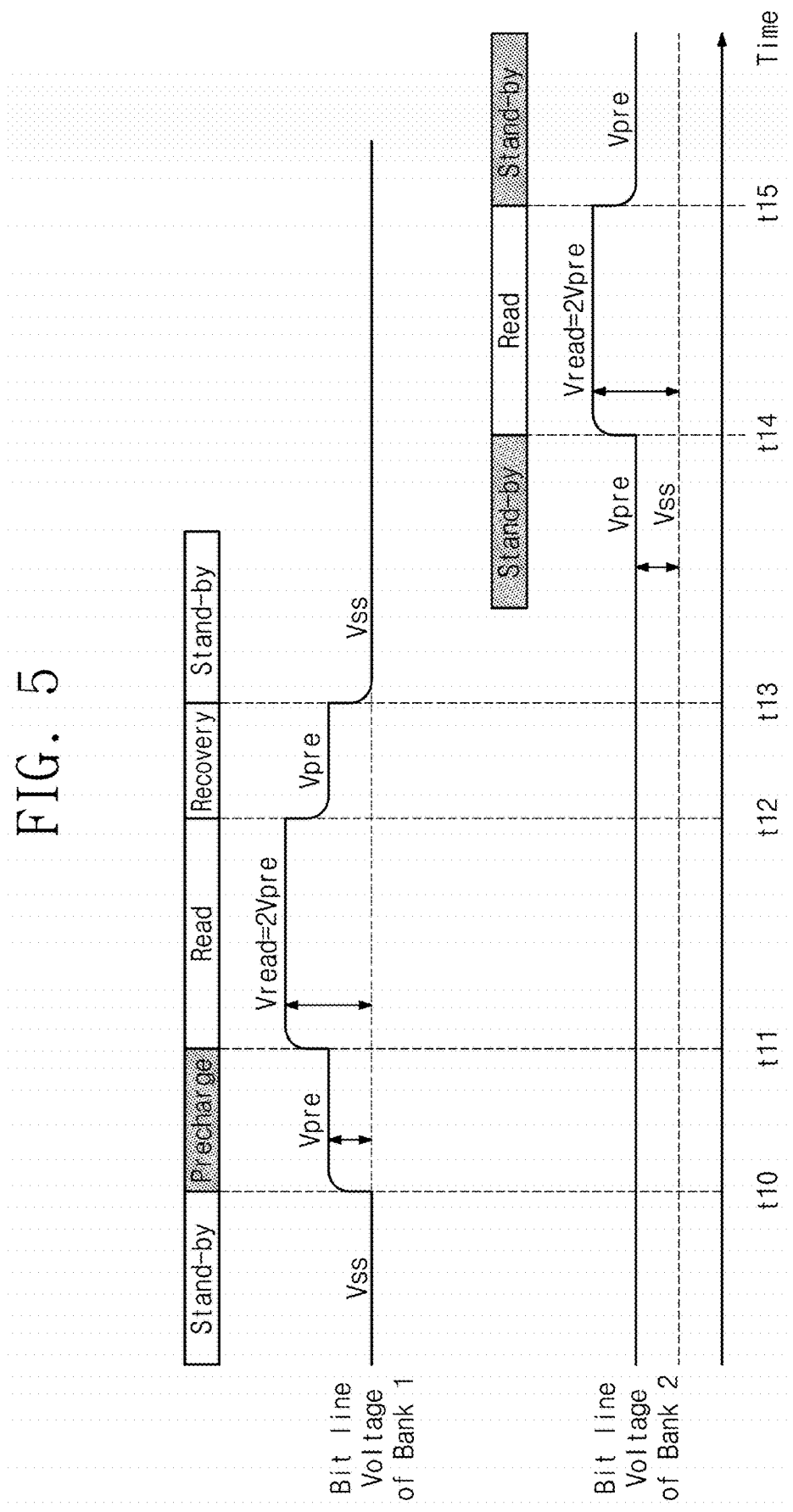
FIG. 5 is a graph illustrating bit line voltages to be provided to first and second banks of FIG. 1 over time.

FIG. 5 is a graph illustrating bit line voltages to be provided to first and second banks of FIG. 1 over time. FIG. 5 will be described with reference to FIG. 1. Only bit line voltages of the first and second banks 150 and 160 are illustrated in FIG. 5, but the principle of FIG. 5 may be identically applied to word line voltages of the first and second banks 150 and 160.

In response to the first row control signal CTRL1_RA in the first control signal CTRL1 output from the first control circuit 130, the column decoder 153 in the first bank 150 of FIG. 1 may discharge a bit line connected with a memory cell in the first bank 150 in a stand-by state. Here, the discharging of the bit line may mean applying a ground voltage Vss or a discharge voltage to the bit line. The column decoder 153 may precharge the bit line connected with the memory cell in the first bank 150 at a time t10 after a read request is received from an external device. Here, the precharging of the bit line may mean applying a voltage (e.g., a precharge voltage Vpre of FIG. 5) greater than "0", not the ground voltage Vss or the discharge voltage, to the bit line.

At a time t11 when the precharge operation is completed, the first control circuit 130 may perform the read operation on the memory cell in the first bank 150. For example, in the read operation, a read voltage Vread (=2Vpre) greater than the precharge voltage Vpre may be applied to the bit line connected with the memory cell in the first bank 150.

At a time t12 when the read operation is completed, a recovery operation may be performed. That is, a voltage of the bit line connected with the memory cell in the first bank 150 may be recovered to the precharge voltage Vpre. However, in some other embodiments, the recovery procedure may be omitted.

At a time t13 when the recovery operation is completed, the ground voltage Vss may be applied to the bit line connected with the memory cell in the first bank 150. That is, a voltage of the bit line connected with the memory cell in the first bank 150 may be recovered to a stand-by state voltage. As a result, in the stand-by state, as the bit line connected with the memory cell in the first bank 150 is maintained at the stand-by state voltage, a potential current leakage may be markedly reduced, and power consumption of the first bank 150 may be reduced.

In response to the second row control signal CTRL2_RA in the second control signal CTRL2 output from the second control circuit 140, the row decoder 162 and the column decoder 163 in the second bank 160 of FIG. 1 may precharge a word line and a bit line connected with a memory cell in the second bank 160 without the stand-by state. That is, the precharge operation may be performed instead of the stand-by state.

At a time t14, the second control circuit 140 may perform the read operation on the memory cell in the second bank 160. For example, in the read operation, the read voltage Vread (=2Vpre) greater than the precharge voltage Vpre may be applied to the bit line connected with the memory cell in the second bank 160.

At a time t15 when the read operation is completed, the precharge voltage Vpre may be applied to the bit line connected with the memory cell in the second bank 160. That is, the memory cell in the second bank 160 may enter the stand-by state immediately without a separate recovery operation.

As such, even in the stand-by state, the bit line and the word line connected with the memory cell in the second bank 160 may maintain the precharge state by the precharge voltage. That is, it is unnecessary to perform a separate precharge operation on the second bank 160. After the stand-by state, with regard to the memory cell in the second bank 160, it is possible to respond to a request of an external device (e.g., a host) at high speed and to perform the write operation at high speed.

Figure 6:
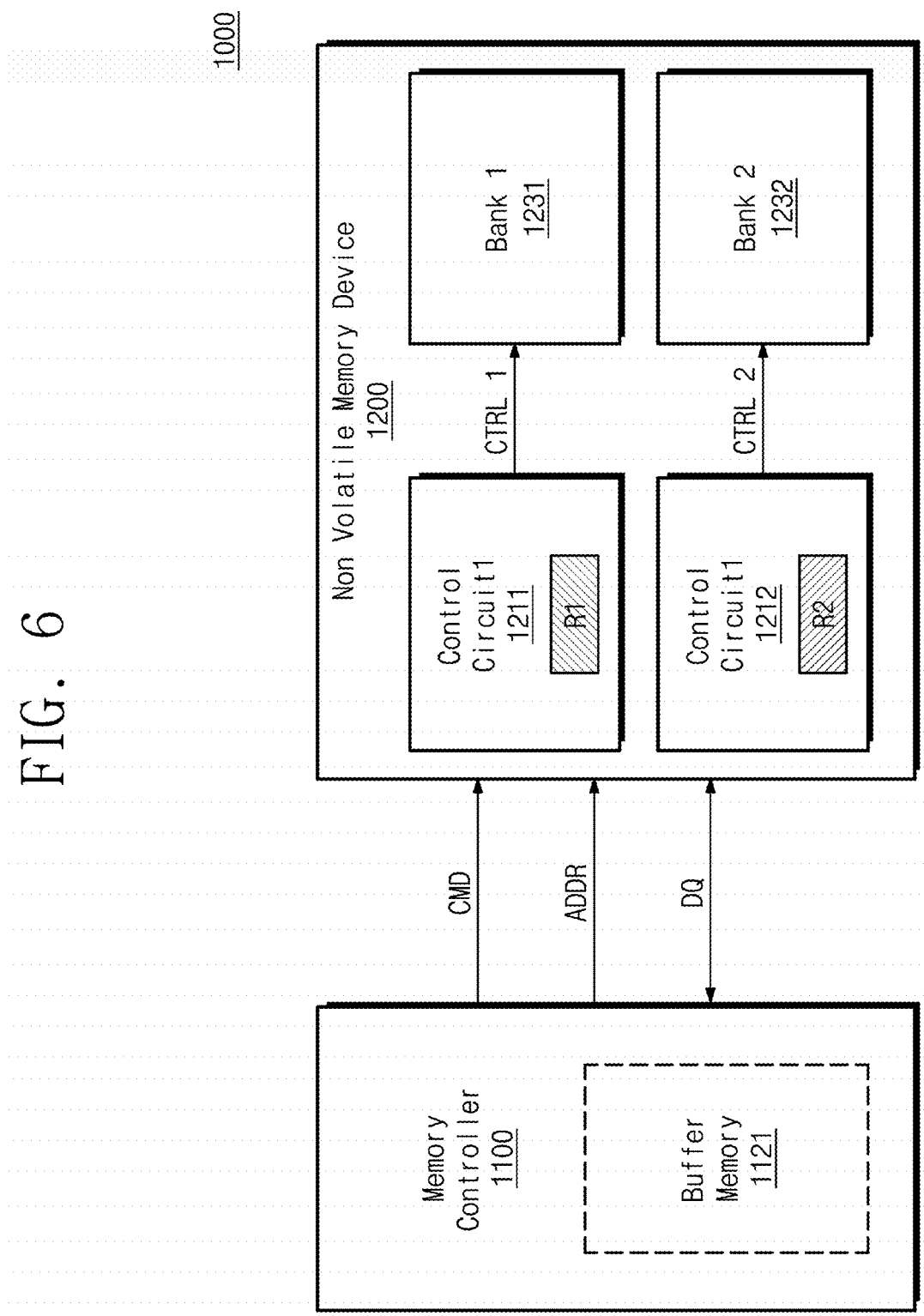
FIG. 6 is a block diagram illustrating a storage device including a nonvolatile memory device of FIG. 6 according to some example embodiments of the inventive concepts.

FIG. 6 is a block diagram illustrating a storage device including a nonvolatile memory device of FIG. 1 according to some example embodiments of the inventive concepts. A storage device 1000 may be also referred to as a "memory system". The storage device 1000 may include a memory controller 1100 and a nonvolatile memory device 1200.

The memory controller 1100 may allow the nonvolatile memory device 1200 to perform the read operation or the write operation. For example, the memory controller 1100 may provide the command CMD, the address ADDR, and the data DQ to the nonvolatile memory device 1200 such that the nonvolatile memory device 1200 performs the write operation.

The memory controller 1100 may provide a physical connection between an external device (e.g., a host) and the nonvolatile memory device 1200. The memory controller 1100 may control the nonvolatile memory device 1200 in response to signals received from the external device. The memory controller 1100 may provide interfacing with the nonvolatile memory device 1200 in compliance with a bus format of the external device. In particular, the memory controller 1100 may decode a command provided from the external device. The memory controller 1100 may access the nonvolatile memory device 1200, based on a result of the decoding.

The memory controller 1100 may include a buffer memory 1121. The buffer memory 1121 may store a mapping table in which first bank addresses of banks operating in a first mode are mapped onto the first mode and second bank addresses of banks operating in a second mode are mapped onto the second mode.

The nonvolatile memory device 1200 may include first and second control circuits 1211 and 1212 and first and second banks 1231 and 1232. The nonvolatile memory device 1200 may be substantially the same as the nonvolatile memory device 100 of FIG. 1 That is, the first and second control circuits 1211 and 1212 may be substantially the same as the first and second control circuits 130 and 140, and first and second banks 1231 and 1232 may be substantially the same as the first and second banks 150 and 160.

Under control of the memory controller 1100, the nonvolatile memory device 1200 may store data and/or may provide data stored therein to the memory controller 1100. The nonvolatile memory device 1200 may be provided as a storage medium of the storage device 1000. For example, the nonvolatile memory device 1200 may be implemented with a phase-change memory (PCM). The nonvolatile memory device 1200 may include a plurality of memory devices. In this case, the memory devices may be connected to the memory controller 1100 in unit of a channel.

The memory controller 1100 may receive a first request corresponding to the first mode from an external device (e.g., a host). The memory controller 1100 may determine whether the first request corresponding to the first mode is associated with the first bank 1231 based on the mapping table stored in the buffer memory 1121. When the first request corresponding to the first mode is associated with the first bank 1231, the memory controller 1100 may select the first bank 1231.

In some example embodiments, the memory controller 1100 may access the first bank 1231 based on the first request including the operation characteristic of the first bank 1231 from an external device (e.g., a host). In this case, the memory controller 1100 may determine an address (e.g., an access-targeted bank address) of the first bank 1231 targeted for the access, based on the first request including the operation characteristic of the first bank 1231. As such, the memory controller 1100 may access the first bank 1231.

In some example embodiments, through the memory controller 1100, the first control circuit 1211 may receive an update request for the first bank 1231 from an external device (e.g., a host) and may then receive a read request from the external device. Here, the update request may refer to a request for updating amplitude and duration values and a timing of a pulse for an operation of the first bank 1231. In the case where the read request is received from an external device (e.g., a host) through the memory controller 1100 after the update request for the first bank 1231 is received from the external device, the first control circuit 1211 may perform the read operation on a memory cell of the first bank 1231 by using a read/write pulse that is different from a read/write pulse used before the update request is received. The first control circuit 1211 may load amplitude and pulse duration values of the read/write pulse different from the read/write pulse used before receiving the update request, from at least one memory cell included in the first bank 1231.

In some example embodiments, the memory controller 1100 may receive a re-categorizing request for banks from an external device (e.g., a host). Here, the re-categorizing request may refer to a request for varying operation characteristics (e.g., amplitude and duration values of a read/write pulse) of the banks. For example, when a first operation characteristic corresponds to the first bank 1231 and a second operation characteristic corresponds to the second bank 1232, in response to the re-categorizing request from the external device, the memory controller 1100 may update the first bank 1231 so as to be set to the second operation characteristic and may update the second bank 1232 so as to be set to the first operation characteristic. In addition, the memory controller 1100 may refer to a third operation characteristic different from the first and second operation characteristics for the purpose of updating the first bank 1231; in response to the re-categorizing request from the external device, the memory controller 1100 may update the first bank 1231 so as to be set to the third operation characteristic. In response to the re-categorizing request from the external device, the memory controller 1100 may map a bank address of the first bank 1231 onto the second mode in the mapping table in response to the re-categorizing request.

In some example embodiments, the memory controller 1100 may activate or access the second bank 1232 while the read operation or the write operation is performed on the first bank 1231. The memory controller 1100 may simultaneously access the second bank 1232 while accessing the first bank 1231. While the read operation is performed on the first bank 1231, the memory controller 1100 may receive a second request corresponding to the second mode, which is different from the first request corresponding to the first bank 1231, from the external device. The memory controller 1100 may determine whether the second request corresponding to the second mode is associated with the second bank 1232 based on the mapping table stored in the buffer memory. When the second request corresponding to the second mode is associated with the second bank 1232, the memory controller 1100 may access the second bank 1232 while the read operation is performed on the first bank 1231.

In some example embodiments, the memory controller 1100 and/or the nonvolatile memory device 1200 may be packaged according to any of a variety of different packaging technologies. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

Figure 7:
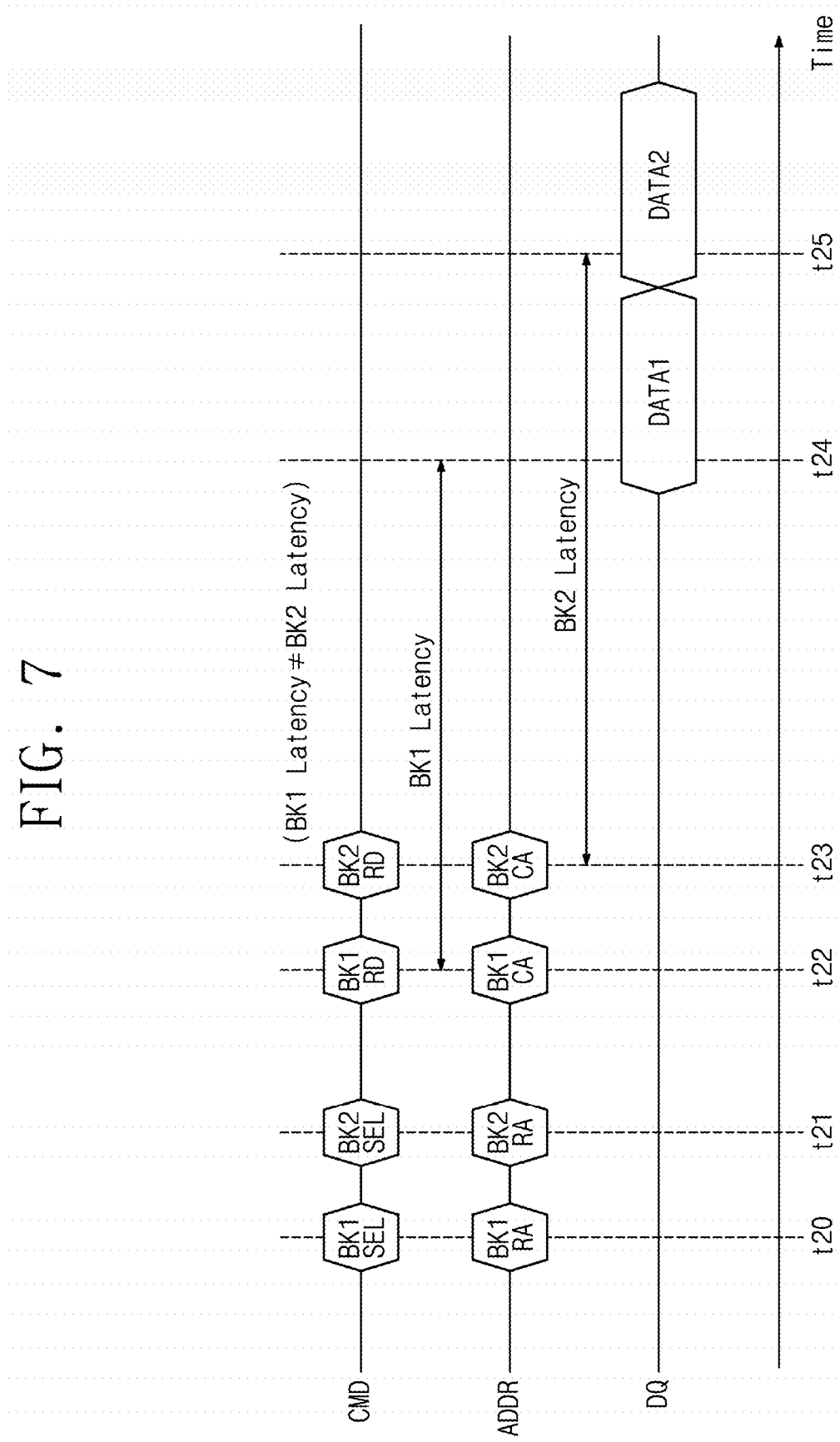
FIG. 7 is a timing diagram of signals provided to a nonvolatile memory device of FIG. 6.

FIG. 7 is a timing diagram of signals provided to a nonvolatile memory device of FIG. 6. FIG. 7 will be described with reference to FIGS. 1 and 6. Timings of transmitting and receiving the command CMD and the address ADDR, and timing of outputting and receiving the data DQ are illustrated in FIG. 7.

The command CMD may include a select command BK1 SEL for the first bank 1231, a select command BK2 SEL for the second bank 1232, a read command BK1 RD for the first bank 1231, and a read command BK2 RD for the second bank 1232. The address ADDR may include a row address BK1 RA for the first bank 1231, a row address BK2 RA for the second bank 1232, a column address BK1 CA for the first bank 1231, and a column address BK2 CA for the second bank 1232. The data DQ may include read data DATA1 of the first bank 1231 and read data DATA2 of the second bank 1232.

At a time t20, the memory controller 1100 may transmit the select command BK1 SEL and the row address BK1 RA for the first bank 1231 to the nonvolatile memory device 1200, and the nonvolatile memory device 1200 may receive the select command BK1 SEL of the first bank 1231 and the row address BK1 RA for the first bank 1231. At a time t21, the memory controller 1100 may transmit the select command BK2 SEL and the row address BK2 RA for the second bank 1232 to the nonvolatile memory device 1200, and the nonvolatile memory device 1200 may receive the select command BK2 SEL of the second bank 1232 and the row address BK2 RA for the second bank 1232. When the memory controller 1200 transmits the select command BK1 SEL and BK2 SEL, the first bank 1231 and the second bank 1232 may be selected in parallel. Being selected in parallel refers to be selected independently and not to be affected by other banks selected by the memory controller 1200. For example, the first bank 1231 and the second bank 1232, selected in parallel, may be simultaneously selected by the memory controller 1200.

At a time t22, the memory controller 1100 may transmit the read command BK1 RD and the column address BK1 CA for the first bank 1231 to the nonvolatile memory device 1200, and the nonvolatile memory device 1200 may receive the read command BK1 RD for the first bank 150 and the column address BK1 CA for the first bank 150. At a time t23, the memory controller 1100 may transmit the read command BK2 RD and the column address BK2 CA for the second bank 1232 to the nonvolatile memory device 1200, and the nonvolatile memory device 1200 may receive the read command BK2 RD for the second bank 160 and the column address BK2 CA for the second bank 160.

At a time t24, the first bank 1231 may output the read data DATA1 from at least one memory cell in the first bank 1231 and the memory controller 1100 may receive the read data DATA1. At a time t25, the second bank 1232 may output the read data DATA2 from at least one memory cell in the second bank 1232 and the memory controller 1100 may receive the read data DATA2.

In some example embodiments, the first control signal CTRL1 may include a value of a latency time interval BK1 Latency from a time t22 when the read command BK1 RD of the first bank 150 is received by the nonvolatile memory device 100 to a time t24 when the read data DATA1 are output from the first bank 150. The second control signal CTRL2 may include a value of a latency time interval BK2 Latency from a time t23 when the read command BK2 RD of the second bank 160 is received by the nonvolatile memory device 100 to a time t25 when the data DATA2 are output from the second bank 160. Because a difference exists between a time interval from the time t20 when the first control circuit 130 receives the select command BK1 SEL of the first bank 150 to the time t24 when the first bank 150 outputs the read data DATA1 and a time interval from the time t21 when the second control circuit 140 receives the select command BK2 SEL of the second bank 160 to the time t25 when the second bank 160 outputs the read data DATA2, as illustrated in FIG. 6, a value of the latency time interval BK1 Latency of the first bank 150 and a value of the latency time interval BK2 Latency of the second bank 160 may be different from each other.

In some example embodiments, a time to output the read data DATA1 from the first bank 1231 in response to the read command BK1 RD may be different from a time to output the read data DATA2 from the second bank 1232 in response to the read command BK2 RD. In some other embodiments, signals that are applied to the first bank 1231 may be determined by the first control information in the register R1 of the first control circuit 1211 such that data are output from the first bank 1231 with the first latency. Signals that are applied to the second bank 1232 may be determined by the second control information in the register R2 of the second control circuit 1212 such that data are output from the second bank 1232 with the second latency.

Figure 8:
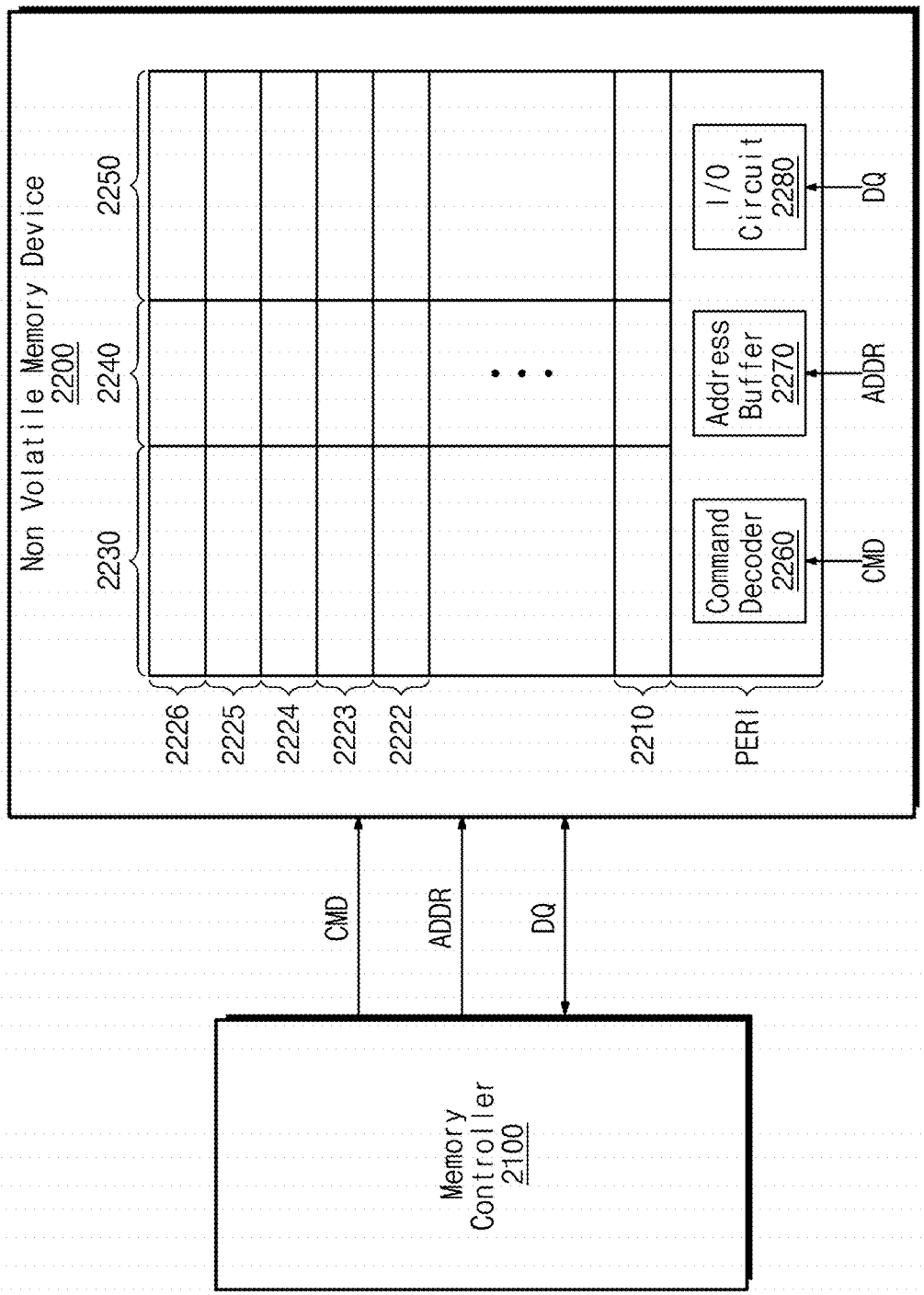
FIG. 8 is a block diagram illustrating a storage device including a nonvolatile memory device of FIG. 2 according to some example embodiments of the inventive concepts.

FIG. 8 is a block diagram illustrating a storage device including a nonvolatile memory device of FIG. 2 according to some example embodiments of the inventive concepts. A memory controller may be a memory controller of FIG. 6. A nonvolatile memory device may include the architecture of a nonvolatile memory device of FIG. 2

A memory controller 2100 may be substantially the same as the memory controller 1100 of FIG. 6. Although not illustrated in FIG. 8, the memory controller 2100 may include a buffer memory (e.g. buffer memory 1121 of FIG. 6).

A nonvolatile memory device 2200 may be implemented with the architecture of FIG. 2. First to sixteenth banks 2210 to 2226 may be substantially the same as the first to sixteenth banks 211 to 226 of FIG. 2. That is, the first to sixteenth banks 2210 to 2226 are divided into first, second, and third areas 2230, 2240, and 2250. A command decoder 2260, an address buffer 2270, and an input/output circuit 2280 may be substantially the same as the command decoder 260, the address buffer 270, and the input/output circuit 280 of FIG. 2, respectively.

The memory controller 2100 may divide the first to sixteenth banks 2210 to 2226 into a plurality of categories. For example, the memory controller 2100 may divide the first to sixteenth banks 2210 to 2226 into a first category and a second category. The first category may include the first to eighth banks 2210 to 2218, and the second category may include the ninth to sixteenth banks 2219 to 2226. In this case, banks included in the same category may operate in the same mode, may have the same operation characteristic, and may operate depending on the same operation setting. The memory controller 2100 may differently set a core control operation of banks for each category. Here, the core control operation may mean setting an operation of a circuit that generates a control signal for controlling banks.

The memory controller 2100 may receive a request from an external device (e.g., a host) and may identify the received request. In this case, the received request may be identified according to an operation characteristic corresponding to the request. For example, the received request may correspond to an operation characteristic for reducing or minimizing power consumption, may correspond to an operation characteristic for operating at faster speed, or may correspond to an operation characteristic having higher reliability. The memory controller 2100 may select a relevant bank in response to the identified request. As such, the nonvolatile memory device 2200 may implement optimum performance.

The memory controller 2100 may change the categories of the first to sixteenth banks 2210 to 2226. To change the categories, an external device (e.g., a host) may transmit the re-categorizing request to the memory controller 2100, and the memory controller 2100 may change the categories of the first to sixteenth banks 2210 to 2226 in response to the re-categorizing request. For example, in response to the re-categorizing request, the memory controller 2100 may again divide the first to sixteenth banks 2210 to 2226 of the first and second categories into a third category and a fourth category. Here, the third category may include the thirteenth to sixteenth banks 2223 to 2226, and the fourth category may include the first to twentieth banks 2211 to 2222. An operation characteristic of banks included in the third category may correspond to the operation characteristic of the banks included in the first category, and an operation characteristic of banks included in the fourth category may correspond to the operation characteristic of the banks included in the second category.

Figure 9:
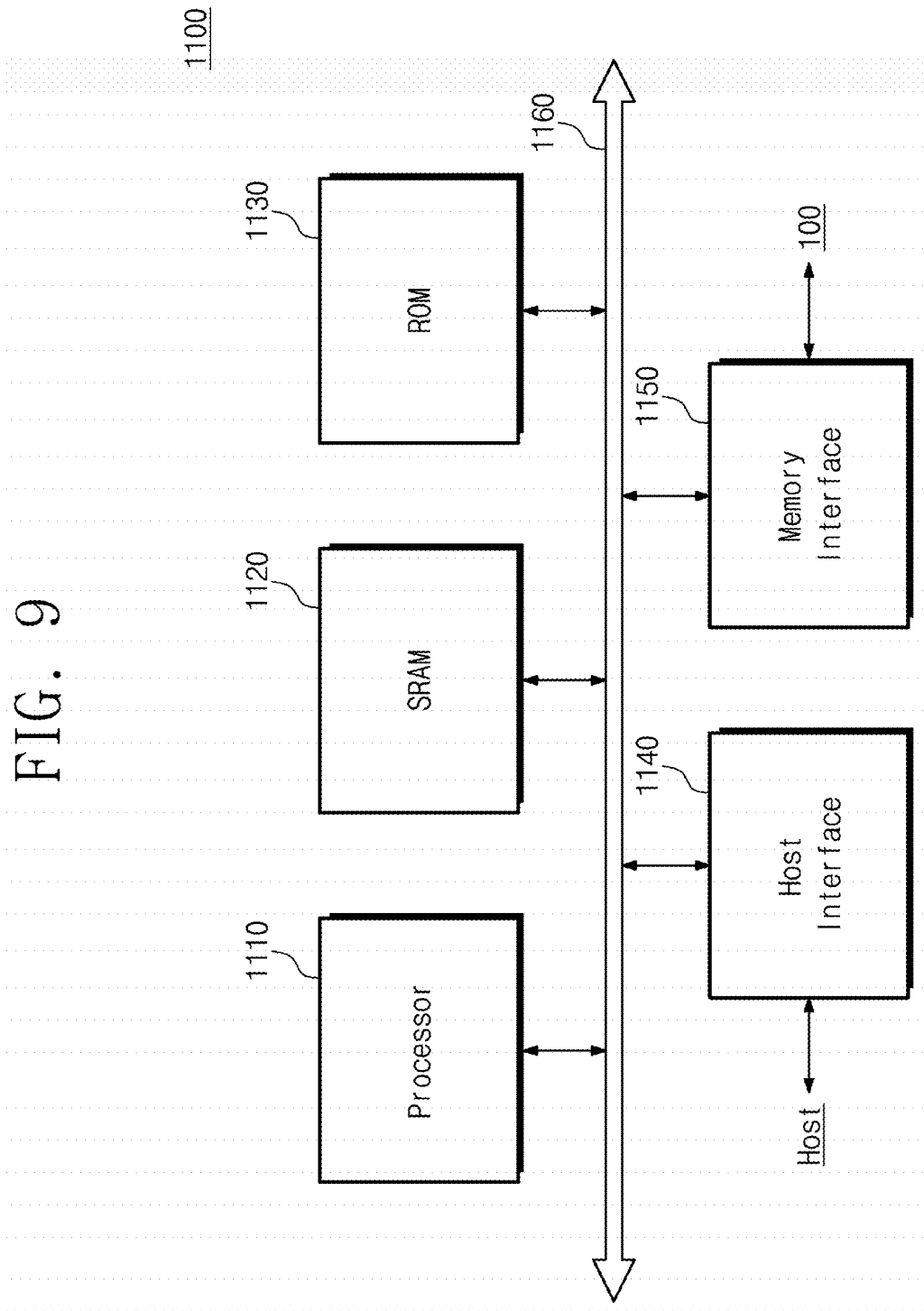
FIG. 9 is a block diagram illustrating a memory controller of FIG. 6.

Like FIG. 3, an example is illustrated in FIG. 9 as the number of banks included in the nonvolatile memory device 2200 is "16", but the inventive concepts are not limited thereto. That is, the number of banks included in the nonvolatile memory device 2200 is not limited to any number.

FIG. 9 is a block diagram illustrating a memory controller of FIG. 6. FIG. 9 will be described with reference to FIG. 6. Referring to FIGS. 1 and 9, the memory controller 1100 may include a processor 1110, an SRAM 1120, a ROM 1130, a host interface 1140, and a memory interface 1150.

The processor 1110 may control overall operations of the memory controller 1100 and may perform various logical operations. For example, the processor 1110 may include a central processing unit (CPU), a graphics processing unit (GPU), a neural processing unit (NPU), a digital signal processor (DSP), etc., and the number of processors may be two or more (e.g., a multi-core processor).

The SRAM 1120 may be used as a cache memory, a working memory, and/or a buffer memory (e.g. buffer memory 1121 of FIG. 6) of the memory controller 1100. The SRAM 1120 may also be used as a cache memory of the processor 1110. The SRAM 1120 may store codes and instructions that the processor 1110 will execute. The SRAM 1120 may store data processed by the processor 1110.

The ROM 1130 may store a variety of information, for the memory controller 1100 to operate, in the form of firmware. In some example embodiments, the variety of information (e.g., a flash translation layer and a mapping table) to control the nonvolatile memory device 1200 may be stored in the SRAM 1120, the ROM 1130, or a separate buffer memory, and may be managed or driven by the processor 1110.

The host interface 1140 may communicate with an external host under control of the processor 1110. The host interface 1140 may transmit requests (e.g., a read/write request and a re-categorizing request) from the host to the processor 1110 through a bus 1160. In some example embodiments, the host interface 1140 may include at least one of various interfaces such as a double DQ rate (DDR) interface, a low-Power DDR (LPDDR) interface, a universal serial bus (USB) interface, a multimedia card (MMC) interface, an embedded MMC (eMMC) interface, a peripheral component interconnection (PCI) interface, a PCI-express (PCI-e) interface, an advanced technology attachment (ATA) interface, a serial-ATA (SATA) interface, a parallel-ATA (PATA) interface, an external SATA (eSATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a universal flash storage (UFS) interface.

The memory interface 1150 may perform communication mediation between the nonvolatile memory device 100 and the memory controller 1100 under control of the processor 1110. That is, the memory controller 1100 may communicate with the nonvolatile memory device 1200 through the memory interface 1150. In some example embodiments, the memory controller 1100 may provide the nonvolatile memory device 1200 with various signals (e.g., CMD, ADDR, and DQ) based on the memory interface 1150.

The bus 1160 provides a communication path between the components of the memory controller 1100. The components of the memory controller 1100 may exchange data with each other based on a bus format of the bus 1160. For example, the bus format may include one or more of various protocols such as USB, SCSI, PCIe, ATA, PATA, SATA, IDE, and UFS.

The memory controller 1100 illustrated in FIG. 9 is an example, and the inventive concepts are not limited thereto. The memory controller 1100 may further include various components such as an error correction code (ECC) engine, a randomizer, and a buffer management circuit.

The memory controller 1100 of FIG. 9 may be described with respect to a storage device of FIG. 6, but the memory controller 2100 of FIG. 8 may be configured to be the same as the memory controller 1100 of FIG. 9.

Figure 10:
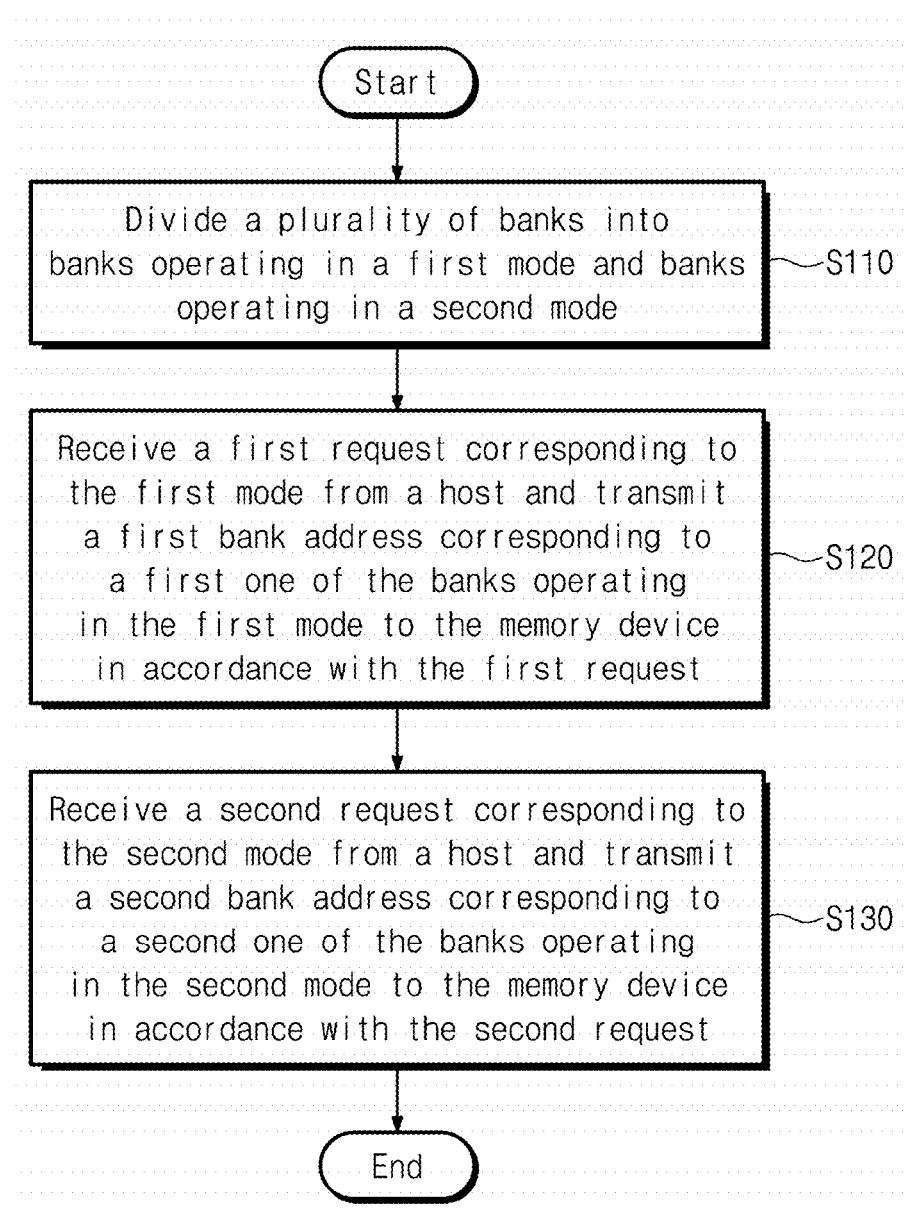
FIG. 10 is a flowchart illustrating an operation method of a memory controller according to some example embodiments of the inventive concepts.

FIG. 10 is a flowchart illustrating an operation method of a memory controller according to some example embodiments of the inventive concepts. FIG. 10 will be described with reference to FIG. 8.

In operation S110, the memory controller 2100 may divide a plurality of banks included in the nonvolatile memory device 2200 into banks operating in a first mode and banks operating in a second mode different from the first mode. In some other example embodiments, the memory controller 2100 may again divide the plurality of banks into banks operating in the first mode, banks operating in the second mode, and banks operating in a third mode different from the first and second modes. Although not illustrated in FIG. 9, as described with reference to FIG. 6, the memory controller 2100 may include a buffer memory in which there is stored in a mapping table where first bank addresses of the banks operating in the first mode are mapped onto the first mode and second bank addresses of the banks operating in the second mode are mapped onto the second mode.

In operation S120, the memory controller 2100 may receive a first request corresponding to the first mode from a host and may transmit a first bank address corresponding to a first bank of the banks operating in the first mode to the nonvolatile memory device 2200 in response to the first request. The memory controller 2100 may determine whether the first request corresponds to the first mode or the second mode.

In operation S130, the memory controller 2100 may further receive a second request corresponding to the second mode from the host and may transmit a second bank address corresponding to a second bank of the banks operating in the second mode to the nonvolatile memory device 2200 in response to the second request. The memory controller 2100 may determine whether the second request corresponds to the first mode or the second mode.

In some example embodiments, after the first bank of the nonvolatile memory device 2200 is selected, the memory controller 2100 may transmit a third request for reading the first bank to the nonvolatile memory device 2200. Here, the second request may be transmitted to the nonvolatile memory device 2200 between the first request and the third request.

In some example embodiments, the memory controller 2100 may receive a write request corresponding to the first mode from the host and may select the first bank of the banks operating in the first mode in response to the write request. The memory controller 2100 may determine a bank address targeted for an access, based on the write request corresponding to the first mode. The memory controller 2100 may access the first bank corresponding to the bank address targeted for an access. However, the inventive concepts are not limited thereto. For example, as in the write request, the memory controller 2100 may receive the bank address targeted for an access from the host. The memory controller 2100 may perform a read/write operation on a memory cell included in one of first banks.

The memory controller 2100 may receive a second read/write request, which includes a command different from the command included in the first read/write request, from the host. While a read/write operation is performed on the memory cell included in one of the first banks, the memory controller 2100 may access one of second banks based on the second read/write request.

Figure 11:
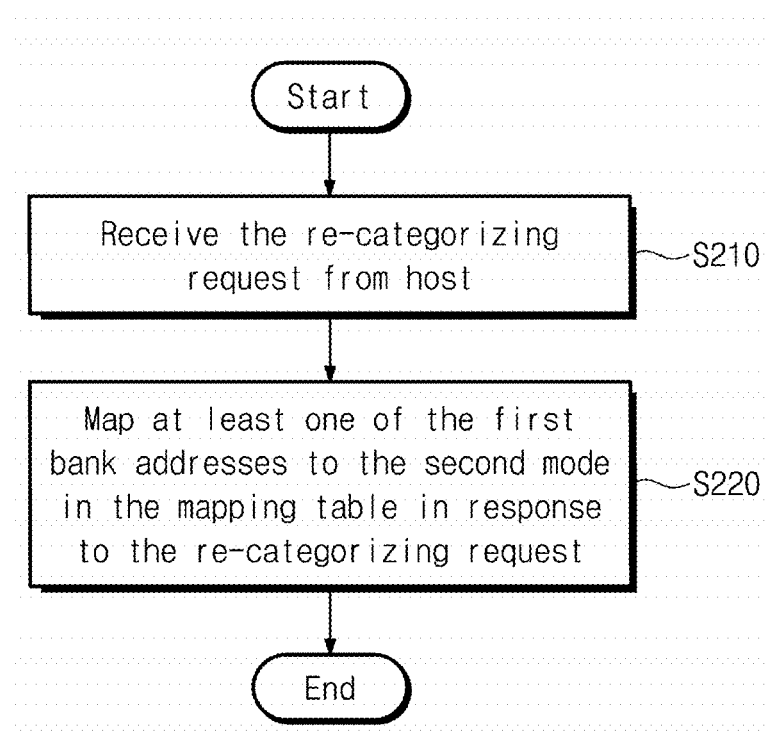
FIG. 11 is a flowchart illustrating a method for varying categories of banks included in a nonvolatile memory device according to some example embodiments of the inventive concepts.

FIG. 11 is a flowchart illustrating a method for varying categories of banks included in a nonvolatile memory device according to some example embodiments of the inventive concepts. FIG. 11 will be described with reference to FIG. 8.

In operation S210, the memory controller 2100 may receive a re-categorizing request from a host.

In operation S220, the memory controller 2100 may map one of first bank addresses onto the second mode in response to the re-categorizing request. However, the inventive concepts are not limited thereto. For example, the memory controller 2100 may map one of first bank addresses onto a third mode different from the first and second modes in response to the re-categorizing request.

A nonvolatile memory device according to some example embodiments of the inventive concepts may differently support operation settings with respect to different requests of a host for each bank (or for respective banks), thus optimizing performance.

A storage device including the nonvolatile memory device according to some example embodiments of the inventive concepts may vary categories of banks included in the nonvolatile memory device and may update values used for operation settings of the banks.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

While the inventive concepts has been described with reference to example embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
a command decoder configured to receive and decode a first command and a second command;
a first control circuit configured to generate first control information under control of the command decoder decoding the first command;
a second control circuit configured to generate second control information under control of the command decoder decoding the second command;
a first bank including a first memory cell which operates based on the first control information; and
a second bank including a second memory cell which operates based on the second control information, wherein
a first time to output data from the first bank in response to the first command is different from a second time to output data from the second bank in response to the second command,
the first control circuit includes a first register configured to include modes of operations of the first bank, operation characteristics of the first bank, and operation settings of the first bank, and
the second control circuit includes a second register configured to include the modes of operations of the second bank, operation characteristics of the second bank, and operation settings of the second bank.

2. The nonvolatile memory device of claim 1, further comprising:
a first read circuit configured to generate a first read signal for the first memory cell, wherein the first read signal has a first amplitude determined according to the first control information; and a second read circuit configured to generate a second read signal for the second memory cell, wherein the second read signal has a second amplitude determined according to the second control information, the second amplitude being different from the first amplitude.

3. The nonvolatile memory device of claim 1, further comprising:
a first read circuit configured to generate a first read signal for the first memory cell, wherein the first read signal has a first pulse period determined according to the first control information; and
a second read circuit configured to generate a second read signal for the second memory cell, wherein the second read signal has a second pulse period determined according to the second control information, the second pulse period being different from the first pulse period.

4. The nonvolatile memory device of claim 3, wherein the first control circuit is configured to load a value of the first pulse period from at least one third memory cell included in the first bank.

5. The nonvolatile memory device of claim 1, wherein
the command decoder is configured to receive an update request for the first bank from a host,
the first control circuit is configured to store the second control information instead of the first control information under control of the command decoder receiving the update request, and
the first memory cell of the first bank is configured to operate based on the second control information instead of the first control information, in response to a termination that the command decoder received a third command for the first memory cell of the first bank from the host.

6. The nonvolatile memory device of claim 1, further comprising:
a first column decoder configured to operate in response to the first control information, wherein the first column decoder is configured to
discharge a bit line connected with the first memory cell in a stand-by state and
precharge the bit line connected with the first memory cell after receiving a read request from a host; and
a second column decoder configured to precharge a bit line connected with the second memory cell without the stand-by state, in response to the second control information.

7. The nonvolatile memory device of claim 1, wherein the second memory cell of the second bank operates based on the second control information while the first memory cell of the first bank operates based on the first control information.

8. The nonvolatile memory device of claim 1, wherein the first and second memory cells are phase-change random access memory (PRAM) cells.

9. An operation method of a memory controller which is connected with a memory device, the method comprising:
dividing a plurality of banks of the memory device into banks operating in a first mode and banks operating in a second mode different from the first mode, the first mode and second mode being in a set of modes;
receiving a first request and a second request, the first request and second request independently correspond to an operation characteristic, the operation characteristics including reducing power consumption, operating at faster speed, or having higher reliability, the first mode corresponding to at least one of the operation characteristics, the second mode corresponding to a different at least one of the operation characteristics,
identifying the first request as corresponding to one of the set of modes, and transmitting a first bank address corresponding to a first bank of the banks operating in the first mode to the memory device in response to the first request, based on the first request corresponding to the first mode; and
further identifying the second request as corresponding to one of the set of modes and transmitting a second bank address corresponding to a second bank of the banks operating in the second mode to the memory device in response to the second request, based on the second request corresponding to the second mode.

10. The method of claim 9, further comprising:
receiving a third request from the host; and
dividing the plurality of banks into banks operating in the first mode, banks operating in the second mode, and banks operating in a third mode, the third mode corresponding to a different at least one of the operation characteristics and being included in the set of modes.

11. The method of claim 9, wherein dividing includes:
mapping the first bank address corresponding to the first bank onto the first mode;
mapping the second bank address corresponding to the second bank onto the second mode; and
storing a mapping result in a buffer memory of the memory controller.

12. The method of claim 11, further comprising:
receiving a re-categorizing request from the host; and
mapping the first bank address corresponding to the first bank onto the second mode in response to the re-categorizing request.

13. The method of claim 9, wherein
the receiving of the first request from the host includes determining whether the first request corresponds to the first mode or the second mode, and
the receiving of the second request from the host includes determining whether the second request corresponds to the first mode or the second mode.

14. The method of claim 9, further comprising:
transmitting a third request for reading the first bank to the memory device after the first bank is selected in response to the first request, wherein
the second request is transmitted to the memory device between the first request and the third request.

15. A storage device comprising:
a nonvolatile memory device including a first bank, a second bank, a first control circuit configured to control the first bank in response to first control information, and a second control circuit configured to control the second bank in response to second control information; and
a memory controller configured to
transmit a first read command to the nonvolatile memory device in response to a first request of a host to read the first bank and
transmit a second read command to the nonvolatile memory device in response to a second request of the host to read the second bank, wherein
a first latency from a time the memory controller transmits the first read command to a time the memory controller receives data of the first bank corresponding to the first read command is different from a second latency from a time the memory controller transmits the second read command to a time the memory controller receives data of the second bank corresponding to the second read command, the first control circuit includes a first register configured to include modes of operations of the first bank, operation characteristics of the first bank, and operation settings of the first bank, and the second control circuit includes a second register configured to include the modes of operations of the second bank, operation characteristics of the second bank, and operation settings of the second bank.

16. The storage device of claim 15, wherein signals to be applied to the first bank are determined by the first control information such that the data of the first bank are output with the first latency, and signals to be applied to the second bank are determined by the second control information such that the data of the second bank are output with the second latency.

17. The storage device of claim 16, wherein the memory controller is configured to:

further transmit a first select command for selecting the first bank to the nonvolatile memory device before the first read command is transmitted to the nonvolatile memory device; and further transmit a second select command for selecting the second bank to the nonvolatile memory device before the second read command is transmitted to the nonvolatile memory device, wherein a time interval between the first select command and the first read command is different from a time interval between the second select command and the second read command.

18. The storage device of claim 17, wherein, based on the memory controller transmitting the first and second select commands to the nonvolatile memory device, the first bank and the second bank are selected in parallel.

19. The storage device of claim 16, wherein, based on the memory controller again receiving the first request after receiving an update request for the first bank from the host, the signals to be applied to the first bank are determined by the second control information such that the data of the first bank are output with the second latency.

20. The storage device of claim 15, wherein a third latency from a time the first request is received from the host to a time the data of the first bank are output to the host is different from a fourth latency from a time the second request is received from the host to a time the data of the second bank are output to the host.

* * * * *